US011217557B2

(12) United States Patent
Cheng

(10) Patent No.: US 11,217,557 B2
(45) Date of Patent: Jan. 4, 2022

(54) ELECTRONIC DEVICE HAVING CONDUCTIVE PARTICLE BETWEEN PADS

(71) Applicant: InnoLux Corporation, Miao-Li County (TW)

(72) Inventor: Pai-Chiao Cheng, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 16/412,375

(22) Filed: May 14, 2019

(65) Prior Publication Data
US 2020/0365551 A1     Nov. 19, 2020

(51) Int. Cl.
*H01L 23/48* (2006.01)
*H01L 23/00* (2006.01)
*H01L 23/31* (2006.01)

(52) U.S. Cl.
CPC .......... *H01L 24/83* (2013.01); *H01L 23/3142* (2013.01); *H01L 24/13* (2013.01); *H01L 24/16* (2013.01); *H01L 24/29* (2013.01); *H01L 24/32* (2013.01); *H01L 24/81* (2013.01); *H01L 2224/32157* (2013.01); *H01L 2224/8348* (2013.01); *H01L 2224/83385* (2013.01); *H01L 2224/83424* (2013.01); *H01L 2224/83466* (2013.01); *H01L 2224/83851* (2013.01)

(58) Field of Classification Search
CPC ...................... H01L 24/83; H01L 24/32; H01L 2224/83424; H01L 2224/83466; H01L 2224/32157; H01L 2224/83385; H01L 2224/8348; H01L 2224/83851; H01L 24/29; H01L 24/13; H01L 24/81; H01L 24/16; H01L 24/05; H01L 24/11; H01L 24/14; H01L 24/17; H01L 23/3142
See application file for complete search history.

(56) References Cited

U.S. PATENT DOCUMENTS

| 7,038,327 | B2* | 5/2006 | Ho ......................... H05K 1/117 257/729 |
| 8,355,087 | B2* | 1/2013 | Yeh ..................... G02F 1/13458 349/42 |
| 2002/0105263 | A1 | 8/2002 | Kim |
| 2010/0065852 | A1 | 3/2010 | Lin |
| 2011/0201193 | A1* | 8/2011 | Bekku ..................... H01L 24/11 438/610 |

(Continued)

FOREIGN PATENT DOCUMENTS

| JP | 2008-203484 A | 9/2008 |
| JP | 2018-200377 A | 12/2018 |
| WO | 1998010465 | 3/1998 |

OTHER PUBLICATIONS

Aleš Duraj et al., Diagnostic Tools for Evaluation of the Quality of the Anisotropic Conductive Adhesive Joints, 2006, pp. 132-136, IEEE, ISSE 2006 St. Marienthal, Germany, XP031093948.

(Continued)

*Primary Examiner* — Shouxiang Hu
(74) *Attorney, Agent, or Firm* — Winston Hsu

(57) ABSTRACT

An electronic device includes a substrate, a first pad disposed on the substrate, a second pad disposed opposite to the first pad, and a conductive particle disposed between the first pad and the second pad. The first pad has a recess, and a part of the conductive particle sinks in the recess.

18 Claims, 14 Drawing Sheets

(56) References Cited

U.S. PATENT DOCUMENTS

| | | |
|---|---|---|
| 2016/0141390 A1 | 5/2016 | Kao |
| 2018/0040774 A1 | 2/2018 | Lee |
| 2018/0120612 A1 | 5/2018 | Lius |
| 2019/0114957 A1 | 4/2019 | Fan |
| 2019/0305070 A1* | 10/2019 | Lee .................. H05K 3/323 |

OTHER PUBLICATIONS

Laura Frisk, Study of Structure and Failure Mechanisms in ACA Interconnections Using SEM, Scanning Electron Microscopy, Mar. 9, 2012, pp. 491-516, XP055738334.

Jin Sik Jeong et al., Properties Investigation of Chip-on-Film (COF) Thermosonic Bonding Using Anisotropic Conductive Films (ACFs), Materials Transactions, Nov. 2, 2012, pp. 2097-2103, vol. 53, No. 12, The Japan Institute of Metals, XP055738414.

Myung-Jin Yim et al., Design and Understanding of Anisotropic Conductive Films (ACF's) for LCD Packaging, IEEE Transactions on Components, Packaging, and Manufacturing Technology—Part A, Jun. 1998, pp. 226-234, vol. 21, No. 2, IEEE, XP011011105.

\* cited by examiner

ELECTRONIC DEVICE HAVING CONDUCTIVE PARTICLE BETWEEN PADS

BACKGROUND OF THE DISCLOSURE

1. Field of the Disclosure

The present disclosure is related to an electronic device, and more particularly, to an electronic device including conductive pads for electrical connecting.

2. Description of the Prior Art

As the development of technology, electronic devices are widely used in daily life. It is still in need of improving the quality of electrical connection between electric elements for the manufacturers, so as to improve the reliability of electronic devices.

SUMMARY OF DISCLOSURE

One of the objectives of the present disclosure is to provide an electronic device with a specific structure that can provide better reliability of the electrical connection between conductive pads.

An embodiment of the present disclosure provides an electronic device including a substrate, a first pad disposed on the substrate, a second pad disposed opposite to the first pad, and a conductive particle disposed between the first pad and the second pad. The first pad has a recess, and a part of the conductive particle sinks in the recess.

Another embodiment of the present disclosure provides an electronic device including a substrate, a first pad disposed on the substrate, and a conductive particle disposed on the substrate, without overlapping with the first pad. The first pad has a recess. The recess has a first width. The conductive particle has a third width. A ratio of the first width to the third width is in a range from 0.25 to 1.

These and other objectives of the present disclosure will no doubt become obvious to those of ordinary skill in the art after reading the following detailed description of the embodiment that is illustrated in the various figures and drawings.

DETAILED DESCRIPTION

Figure 1:
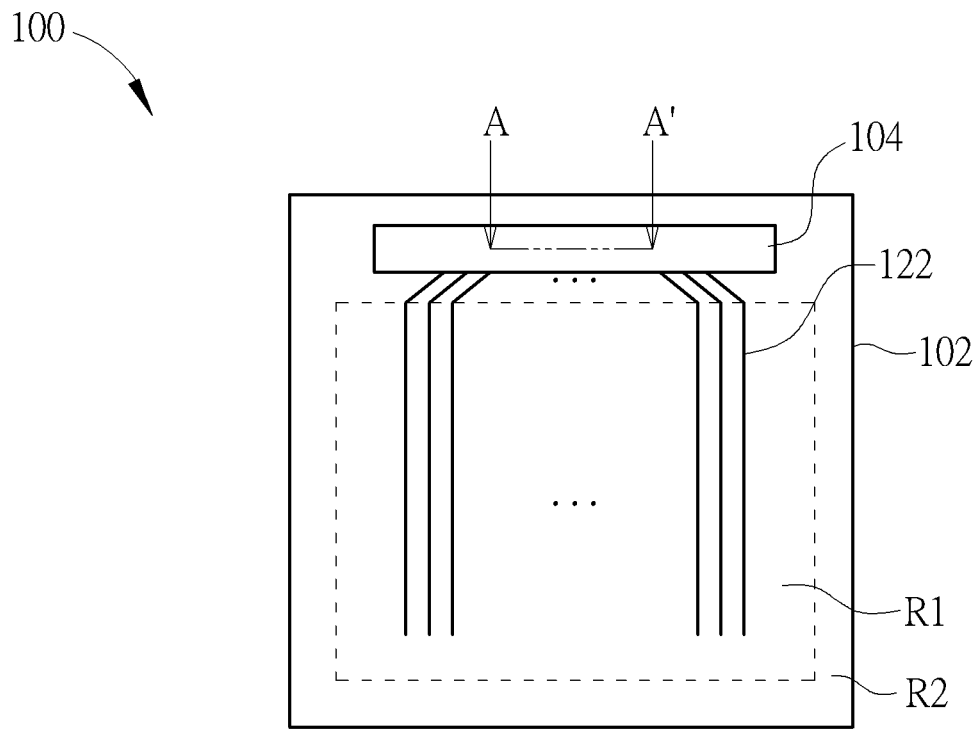
FIG. 1 is a schematic top view of an electronic device according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of an electronic device (e.g. a display device in this disclosure), and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present disclosure, the corresponding features, areas, steps, operations and/or components would be pointed to existence, but not limited to the existence of one or a plurality of the corresponding features, areas, steps, operations and/or components.

When the corresponding component such as layer or area is referred to "on another component (or the variant thereof)" or "extend to another component", it may be directly on another component or directly extend to another component, or other component may exist between them. On the other hand, when the component is referred to "directly on another component (or the variant thereof)" or "directly extend to another component", any component does not exist between them.

It will be understood that when an element or layer is referred to as being "connected to" another element or layer, it can be directly connected to the other element or layer, or intervening elements or layers may be presented. In contrast, when an element is referred to as being "directly connected to" another element or layer, there are no intervening elements or layers presented. In addition, when the component is referred to "be coupled to/with another component (or the variant thereof)", it may be directly connected to another component, or may be indirectly connected (such as electrically connected) to another component through other component or components.

It will be understood that when "a portion of a structure" is between another two components, this structure can be totally between or partially between these components.

The terms "about", "substantially", "equal", or "same" generally mean within 20% of a given value or range, or mean within 10%, 5%, 3%, 2%, 1%, or 0.5% of a given value or range.

Although terms such as first, second, third, etc., maybe used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

Figure 2:
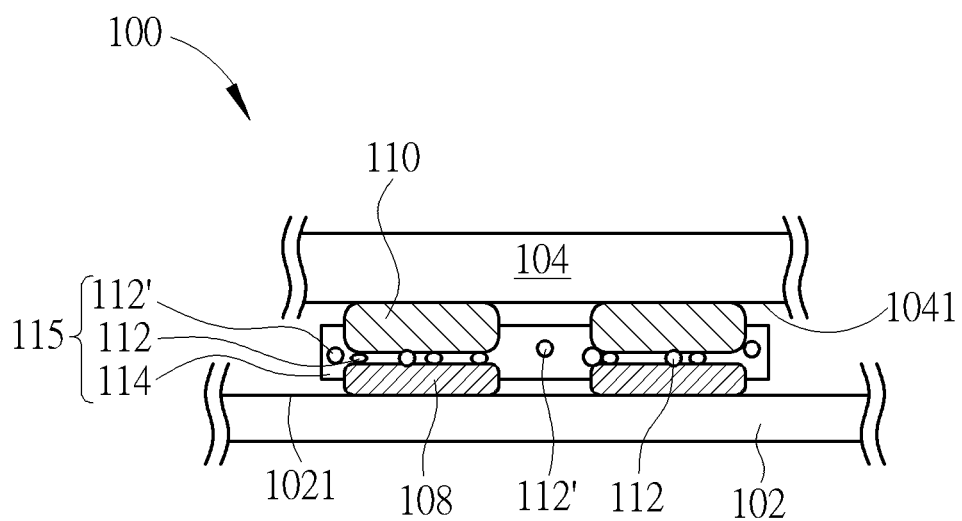
FIG. 2 is a partial schematic sectional view of the electronic device shown in FIG. 1.
Figure 3:
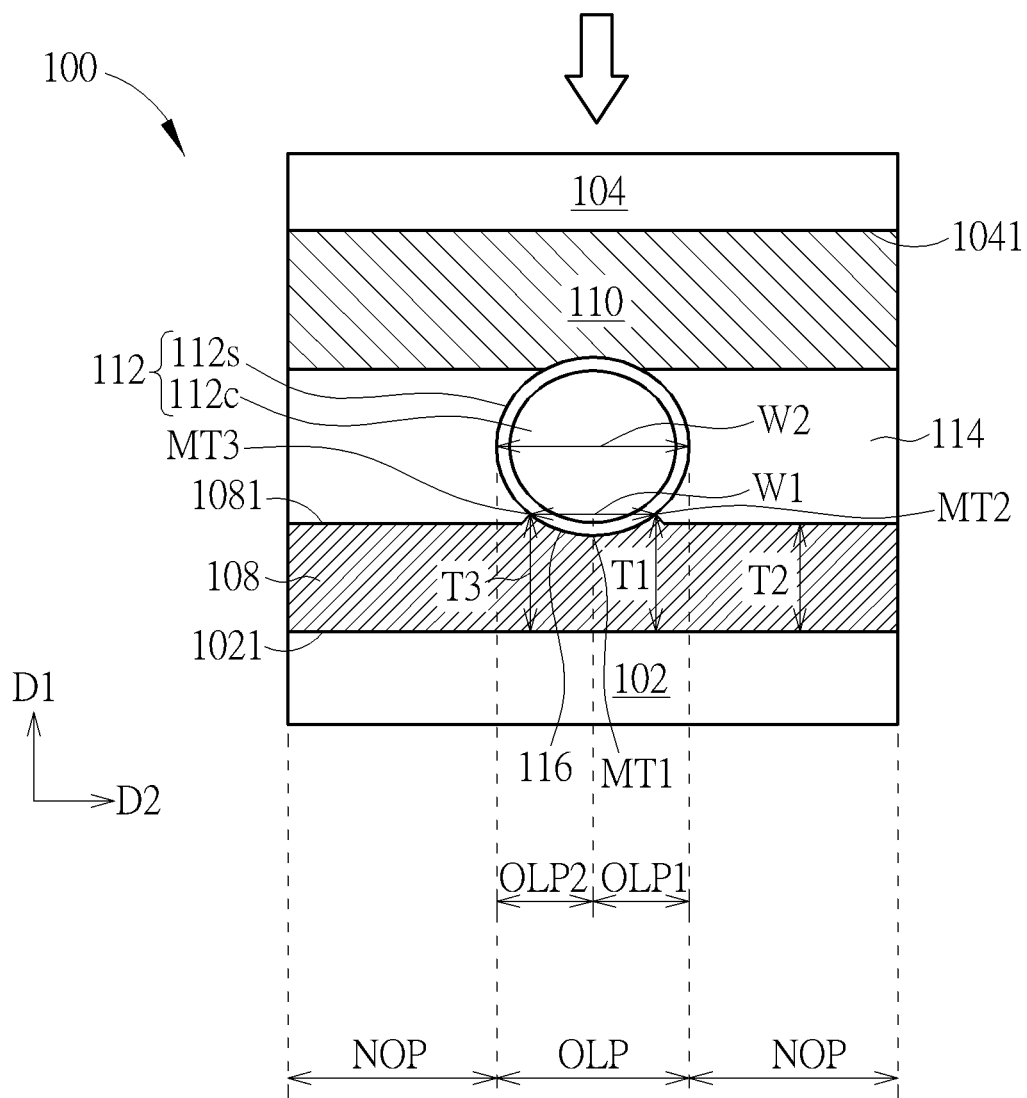
FIG. 3 is a schematic enlargement diagram of a part of the electronic device shown in FIG. 2.

Referring to FIG. 1 to FIG. 3, FIG. 1 is a schematic top view of an electronic device according to a first embodiment of the present disclosure, FIG. 2 is a partial schematic sectional view of the electronic device along line A-A' shown in FIG. 1, and FIG. 3 is a schematic enlargement diagram of a part of the electronic device shown in FIG. 2. The present disclosure introduces an electronic device 100 that includes electric elements and electrical connections between the electric elements. The electronic device 100 includes at least a substrate 102, and the electric elements are disposed on the substrate 102. In some embodiments, the electronic device 100 may comprise liquid crystals (LC), light-emitting diodes (e.g. micro light-emitting diodes, mini light-emitting diodes, organic light-emitting diodes or quantum dot light-emitting diodes), quantum dot, fluorescence, phosphor, other suitable materials or a combination thereof, but it is not limited. In some embodiments, the electronic device 100 may be a display device, a flexible electronic device, a tiled electronic device, a sensing device, an antenna device, a touch electronic device, any other suitable electronic device or a combination thereof, but it is not limited. As shown in FIG. 1, when the electronic device 100 is a display device, the substrate 102 may include a display region R1 and a peripheral region R2 disposed adjacent to the display region R1. For example, the peripheral region R2 may surround the display region R1. At least one integrated circuit (IC) chip 104 may be disposed on the substrate 102 and in the peripheral region R2. A plurality of wires 122 may be disposed on the substrate 102 and extend in the display region R1 and the peripheral region R2. The IC chip 104 is electrically connected to the wires 122 or other electric elements (not shown) on the substrate 102. As shown in FIG. 2, the electronic device 100 further comprises at least one first pad 108 disposed on the substrate 102 and at least one second pad 110 disposed opposite to the first pad 108. In FIG. 2, two first pads 108 and two second pads 110 are shown for illustration. In detail, the first pads 108 are disposed on the surface 1021 of the substrate 102, wherein one or multiple layers or elements (not shown) may be disposed between or electrically connected with the first pads 108 and the substrate 102. For example, one of the first pads 108 may be electrically connected to one of the wires 122 shown in FIG. 1. The second pads 110 are disposed on the surface 1041 of the IC chip 104. Similarly, one or multiple layers or elements may be disposed between the second pads 110 and the IC chip 104. The electronic device 100 further includes at least one conductive particle 112 disposed between the first pads 108 and the second pads 110. As shown in FIG. 3, the conductive particle 112 is directly in contact with the first pad 108 and the second pad 110 such that the first pad 108 can be electrically connected to the second pad 110 through the conductive particle 112, and therefore the IC chip 104 can be electrically connected to the electric elements, such as the wire 122, through the second pad 110, the conductive particle 112 and the first pad 108. In some embodiments, the second pad 110 may be a connecting pad or a bump of the IC chip 104, but not limited thereto.

Referring to FIG. 3, the first pad 108 has a recess 116 on its top surface 1081, and a part of the conductive particle 112 sinks in the recess 116, which means a part of the conductive particle 112 is in the recess 116, and the other part of the conductive particle 112 is positioned out of the recess 116. The surface of the recess 116 may be directly in contact with a surface of the lower part of the conductive particle 112, thus a contact area between the conductive particle 112 and the first pad 108 can be increased. The effect of the electrical connection between the conductive particle 112 and the first pad 108 can be improved. In another aspect, since a part of the conductive particle 112 sinks in the recess 116, the conductive particle 112 can be fixed on the first pad 108 more firmly.

According to some embodiments, the thickness of the first pad 108 may not be uniform, wherein the thickness of the first pad 108 indicates the total thickness from the bottom layer to the top layer of the first pad 108 in a direction D1, if the first pad 108 has multi layers. Alternatively, the total thickness indicates the distance between the bottom surface and the top surface 1081 of the first pad 108 in the direction Dl. The direction D1 is a normal direction of the substrate 102. The first pad 108 has a first portion OLP that overlaps with the conductive particle 112 in the direction D1 and has a second portion NOP which does not overlap with the conductive particle 112. A maximum thickness T1 of the first portion OLP of the first pad 108 overlapping with the conductive particle 112 may be relatively greater than a minimum thickness T2 of the second portion NOP of the first pad 108 not overlapping with the conductive particle 112. It should be noted that the thickness T1 and the thickness T2 may be measured along the direction D1 in any cross-sectional image, so as to compare the relatively maximum or minimum value in that cross-sectional image. In other words, although in different cross-sections of the electronic device 100, the measured thickness T1 and thickness T2 may have different values respectively, the thickness T1 is still greater than the thickness T2. In some embodiments, when the IC chip 104 with the second pads 110 is bonded and pressed to the substrate 102 as shown by the hollow arrow in FIG. 3, the first portion OLP of the first pad 108 may be pressed to form the recess 116. During the bonding process, a part of the first pad 108 may be squeezed toward the edge of the recess 116, and therefore the edge of the recess 116 may have a greater thickness, which is the thickness T1 mentioned above. In some embodiments, the top surface 1081 of the first pad 108 may be relatively planar or relatively smooth before the bonding process, and the recess 116 is formed after the bonding process, but not limited thereto. In some other embodiments, the top surface 1081 of the first pad 108 may be relatively rough, may have recess-like structure or may have recess before the bonding process, which may help to fix the conductive particle 112 during the bonding process, but not limited thereto.

The conductive particle 112 may include a core 112c and a shell 112s surrounding the core 112c. The core 112c may include resin material or other suitable material. The shell 112s may include conductive material, such as metal, but not limited thereto. The conductive particle 112 may have a round profile before the second pad 110 is bonded to the first pad 108. In the bonding process, when the second pad 110 is pressed toward the first pad 108, the conductive particle 112 positioned between the first pad 108 and the second pad 110 is also pressed to have a relatively flatter profile, such as having oval-shaped profile, and therefore the contact area between the conductive particle 112 and the first pad 108 and/or the contact area between the conductive particle 112 and the second pad 110 can be increased. After the bonding process, part of the shell 112s may be broken or have void(s) or hole(s), which may not affect the conductivity of the conductive particle 112 and the electrical connection between the first pad 108 and the second pad 110.

In addition, FIG. 3 shows a cross-sectional schematic view of the electronic device 100, and a maximum width of the recess 116 in the direction D2 is defined as a first width W1, wherein the direction D2 is perpendicular to the direction D1. The first width W1 can be obtained by the following steps: defining a lowest point MT1 of the recess 116 in the first portion OLP of the first pad 108, part of the first portion OLP at one side (e.g. right side in FIG. 3) of the lowest point MT1 is defined as a third portion OLP1, and another part of the first portion OLP at the other side (e.g. left side in FIG. 3) of the lowest point MT1 is defined as a fourth portion OLP2 ; defining a second point MT2 in the third portion OLP1 having the thickness T1, wherein the thickness T1 is a maximum thickness of the third portion OLP1 in the direction D1; defining a third point MT3 in the fourth portion OLP2 having a thickness T3, wherein the thickness T3 is a maximum thickness of the fourth portion OLP2 in the direction D1; and measuring a distance along the direction D2 between a projection of the second point MT2 and a projection of the third point MT3 on the substrate 102 to obtain the first width W1. The first width W1 may be in a range from 1.5 micrometers (μm) to 3.5 μm (1.5 μm≤W1≤3.5 μm). For example, the first width W1 may be 1.7 μm, 2 μm, 2.3 μm, 2.5 μm, 2.7 μm, 3 μm or 3.2 μm, but not limited thereto. In the direction D2, a maximum width of the conductive particle 112 is defined as a second width W2. The second width W2 can be obtained by measuring the core 112c together with the shell 112s along the direction D2. The second width W2 may be in a range from 2 μm to 6 μm (2 μm≤W2≤6 μm). For example, the width W2 may be 2.5 μm, 3 μm, 3.5 μm, 4 μm, 4.5 μm, 5 μm or 5.5 μm, but not limited thereto. According to some embodiments, the first width W1 is less than or equal to the second width W2. It should be noted that the first width W1 and the second width W2 may be measured along the direction D2 in any cross-sectional image, so as to compare the relatively maximum or minimum value in that cross-sectional image. In other words, the electronic device 100 may have different values of the first width W1 and the second width W2 in different cross-sectional images, but the first width W1 and the second width W2 still have the same relative relationship: W1≤W2.

In addition, a ratio of the first width W1 to the second width W2 may be in a range from 0.25 to 1 (0.25≤W1/W2≤1). For example, the ratio may be 0.3, 0.4, 0.5, 0.6, 0.7, 0.8 or 0.9, but not limited thereto. The above-mentioned relationships may express that the size (or projection area on the substrate 102) of the recess 116 is less than or equal to the size (or projection area on the substrate 102) of the conductive particle 112, and part of the conductive particle 112 is not contained or sink in the recess 116. This design may bring a better electrical connection effect between the first pad 108 and the second pad 110. If the second width W2 is less than the first width W1, the recess 116 is greater than the conductive particle 112 and most of or all of the conductive particle 112 may be sink in the recess 116. The contact area between the conductive particle 112 and the second pad 110 may be decreased, and the electrical connection effect between the first pad 108 and the second pad 110 maybe affected. In some embodiments, if the recess 116 is too large, the conductive particle 112 may easily slip or roll in the recess 116, thus the difficulty of fixing the conductive particle 112 may be increased.

Referring to FIG. 2 and FIG. 3, the electronic device 100 may further include an adhesive layer 114 disposed between the substrate 102 and the IC chip 104, and a plurality of conductive particles 112' are disposed in the adhesive layer 114 between the substrate 102 and the IC chip 104. The adhesive layer 114 may also be disposed between the first pads 108 and the second pads 110, and a plurality of conductive particles 112 are disposed in the adhesive layer 114 between the first pads 108 and the second pads 110. In some embodiments, an anisotropic conductive film (ACF) 115 maybe provided for bonding the IC chip 104 onto the substrate 102. The anisotropic conductive film 115 may include the adhesive layer 114, the conductive particles 112' and the conductive particles 112. The conductive particles 112' may have relatively round shapes. When the IC chip 104 is pressed onto the substrate 102, the conductive particle 112 located between the first pads 108 and the second pads 110 may be pressed to have a relatively oval profile, and the conductive particle 112 may sink in the recess 116.

The electronic device of the present disclosure is not limited to the above mentioned embodiment. Further embodiments or variant embodiments of the present disclosure are described below. It should be noted that the technical features in different embodiments described can be replaced, recombined, or mixed with one another to constitute another embodiment without departing from the spirit of the present disclosure. For making it easier to compare the difference between the embodiments and variant embodiments, the following description will detail the dissimilarities among different variant embodiments or embodiments and the identical features will not be redundantly described.

Figure 4:
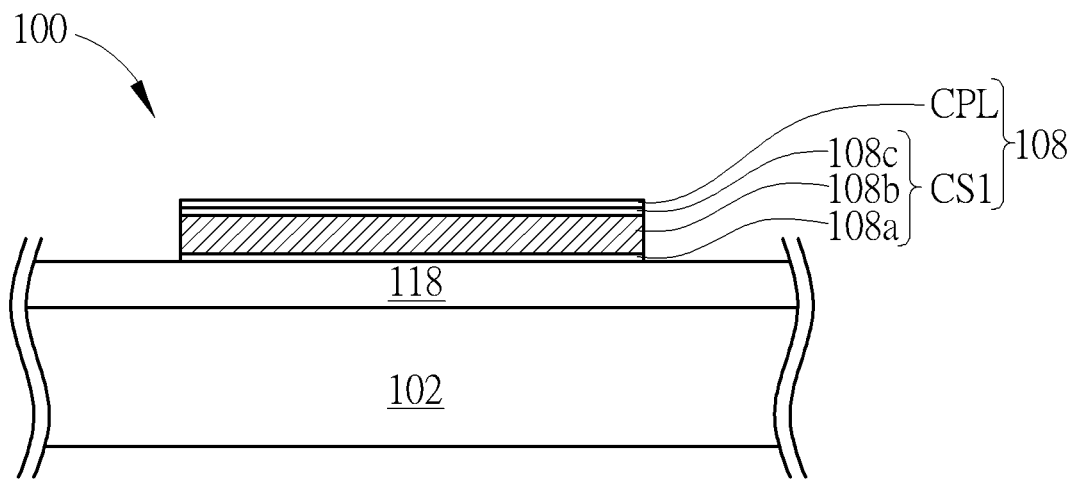
FIG. 4 is a schematic diagram of a first pad of an electronic device according to a second embodiment of the present disclosure.

FIG. 4 is a schematic diagram of a first pad of an electronic device according to a second embodiment of the present disclosure. FIG. 4 shows the profile of the first pad 108 when the anisotropic conductive film 115 and the second pad 110 have not been disposed on the first pad 108. As shown in FIG. 4, the first pad 108 may be in a multilayer structure in some embodiments. In detail, the first pad 108 may include a first conductive set CS1 which includes multiple conductive layers, such as multiple metal layers. For example, the first conductive set CS1 may include a first conductive layer 108a, a second conductive layer 108b, and a third conductive layer 108c stacked in sequence on the substrate 102 to from a stacking structure. A material of the first conductive layer 108a, the second conductive layer 108b, and the third conductive layer 108c may include the same or different materials. In some embodiments, the first conductive set CS1 may include a stacking structure having a molybdenum (Mo) layer, an aluminum (Al) layer and a Mo layer (represented as Mo/Al/Mo stacking structure), a titanium (Ti)/Al/Ti stacking structure, a Mo/Al/Ti stacking structure, a Ti/Al/Mo stacking structure, other stacking structure with suitable materials or a combination thereof, but it is not limited thereto. Taking the Mo/Al/Mo stacking structure as an example, the first conductive layer 108a is a Mo layer, the second conductive layer 108b is an Al layer, and the third conductive layer 108c is a Mo layer. The second conductive layer 108b including the material of Al can have a good conductivity, and the first conductive layer 108a and the third conductive layer 108c including the material of Mo can provide better adhesion for the first pad 108 or other layers. The other stacking structure mentioned above may have similar structures and functions, which will not be described repeatedly. In addition, in some other embodiments, the first pad 108 may include at least one metal layer and a conductive protection layer CPL disposed on the at least one metal layer. For example, the at least one metal layer maybe a Mo layer or a Ti layer that replaces the stacking structure of the first conductive set CS1 mentioned-above or shown in FIG. 4; alternatively, the at least one metal layer may indicates one of the first conductive layer 108a, the second conductive layer 108b, and the third conductive layer 108c in the first conductive set CS1, but not limited thereto. The conductive protection layer CPL may include the conductive material with corrosion resistivity or rigidity better than metal. For instance, the conductive protection layer CPL may be an oxygen-containing conductive layer or an oxide layer, such as an indium tin oxide (ITO) layer, but not limited thereto. In another aspect, the electronic device 100 may further include an insulating layer 118 disposed between the first pad 108 and the substrate 102, and the first pad 108 may be directly in contact with the insulating layer 118 (e.g. the top surface of the insulating layer 118). The insulating layer 118 may provide buffer function during the bonding process.

Figure 5:
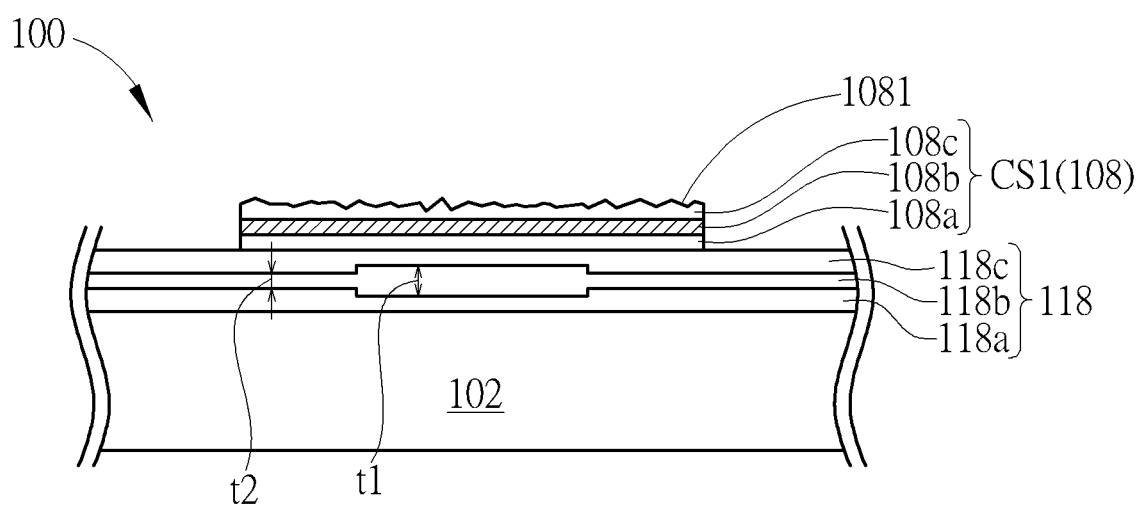
FIG. 5 is a schematic diagram of a first pad of an electronic device according to a third embodiment of the present disclosure.

FIG. 5 is a schematic diagram of a first pad of an electronic device according to a third embodiment of the present disclosure. FIG. 5 shows the profile of the first pad 108 when the anisotropic conductive film 115 and the second pad 110 have not been disposed on the first pad 108. In some embodiments, the first pad 108 may have an uneven top surface 1081. In other words, the top surface 1081 of the first pad 108 may have a certain roughness or micro-patterns before bonding. This design may help fixing the conductive particles disposed thereon. In FIG. 5, the top surface 1081 may also be the top surface of the third conductive layer 108c, but not limited thereto. In addition, the insulating layer 118 disposed between the first pad 108 and the substrate 102 may be in a multilayer structure and have a plurality of sub-insulating layers 118a, 118b, and 118c for example. In some embodiments, at least one of the sub-insulating layers 118a, 118b, and 118c may have a different thickness from another one of the sub-insulating layers 118a, 118b, and 118c. In some other embodiments, one of the sub-insulating layers 118a, 118b, and 118c may have inconstant thickness. Taking the sub-insulating layer 118b as an example, a portion of the sub-insulating layer 118b may have a thickness t1 and another portion of the sub-insulating layer 118b may have a thickness t2, the thickness t2 maybe less than the thickness t1. In some embodiments, the thickness t1 may correspond to the first pad 108, but not limited thereto. The thicker portion of the sub-insulating layer 118b may provide a buffer function during the bonding process.

According to the present disclosure, in order to provide a better effect of the bonding process of the IC chip on the substrate, the process pressure, the process temperature, the material of the conductive particle, the thickness and property of material of the first pad, the thicknesses of the composition structure, materials of the composition layers of the first pad, and/or the roughness of the first pad can be selected and adjusted based on practical requirement by referring to all the embodiments and variant embodiments introduced in this specification. For example, the materials and thicknesses of the different conductive layers of the multilayer structure of the first pad may be adjusted to obtain an expected property of the recess of the first pad.

Figure 6:
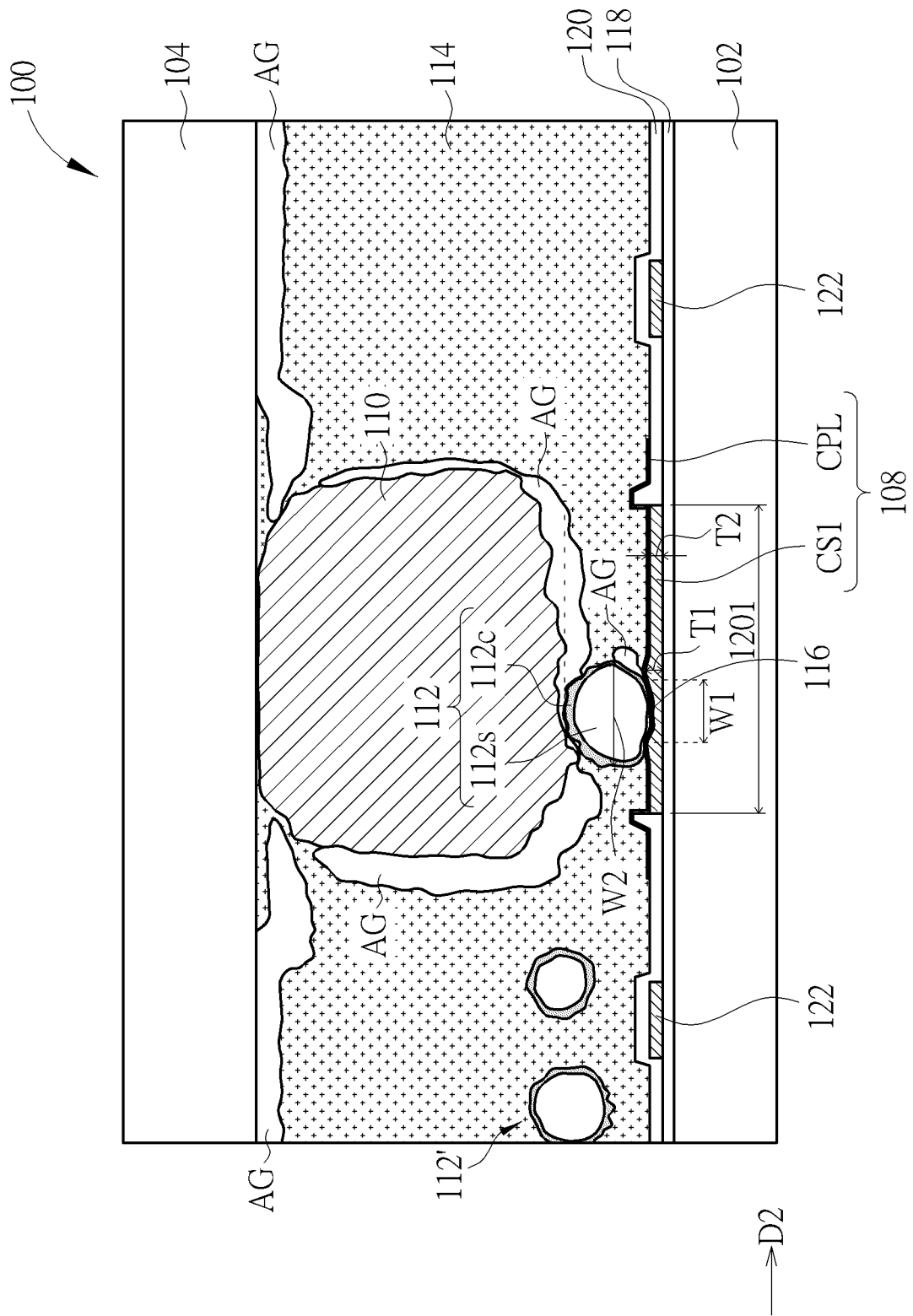
FIG. 6 is a partial schematic outline of a scanning electron microscope (SEM) diagram of an electronic device according to a first exemplary embodiment of the present disclosure.

Referring to FIG. 6, FIG. 6 is a partial schematic outline of a scanning electron microscope (SEM) diagram of an electronic device according to a first exemplary embodiment of the present disclosure. In this exemplary embodiment, one conductive particle 112 is disposed between the first pad 108 and the second pad 110. The first pad 108 has a first conductive set CS1 and a conductive protection layer CPL disposed on the first conductive set CS1. As an example, the first conductive set CS1 may include a Ti/Al/Ti stacking structure, and the conductive protection layer CPL may be an ITO layer. The recess 116 of the first pad 108 is formed by the conductive protection layer CPL and part of the first conductive set CS1. The maximum thickness T1 of the first pad 108 overlapping with the conductive particle 112 is greater than the minimum thickness T2 of the first pad 108 not overlapping with the conductive particle 112. The first width W1 of the recess 116 in the direction D2 is less than or equal to the second width W2 of the conductive particle 112 in the direction D2. These relationships between the first width W1 and the second width W2, and between the thickness T1 and the thickness T2 may apply to the following exemplary embodiments, which will not be repeated. In addition, the electronic device 100 may further include an insulating layer 120 disposed on the substrate 102. The insulating layer 120 has an opening 1201 exposing the first conductive set CS1, which means at least part of a top surface of the first conductive set CS1 is exposed in the opening 1201. The conductive protection layer CPL covers the first conductive set CS1 in the opening 1201 and extends over the opening 1201 to cover a portion of the insulating layer 120. Accordingly, the conductive protection layer CPL is directly in contact with the first conductive set CS1 through the opening 1201, and electrically connected to the first conductive set CS1. Furthermore, the electronic device 100 may include at least one wire 122 disposed on the substrate 102 and covered by the insulating layer 120. It should be noted that since SEM diagram is obtained by a cutting process to form a section sample of the electronic device 100, peelings may occur during the cutting process for the SEM sample. For example, one or more air gaps AG may appear as shown in FIG. 6. It should be noted that the air gaps AG may not exist before the cutting process. The same circumstances will show in the following SEM outline schematic diagrams, which will not be repeated.

Figure 7:
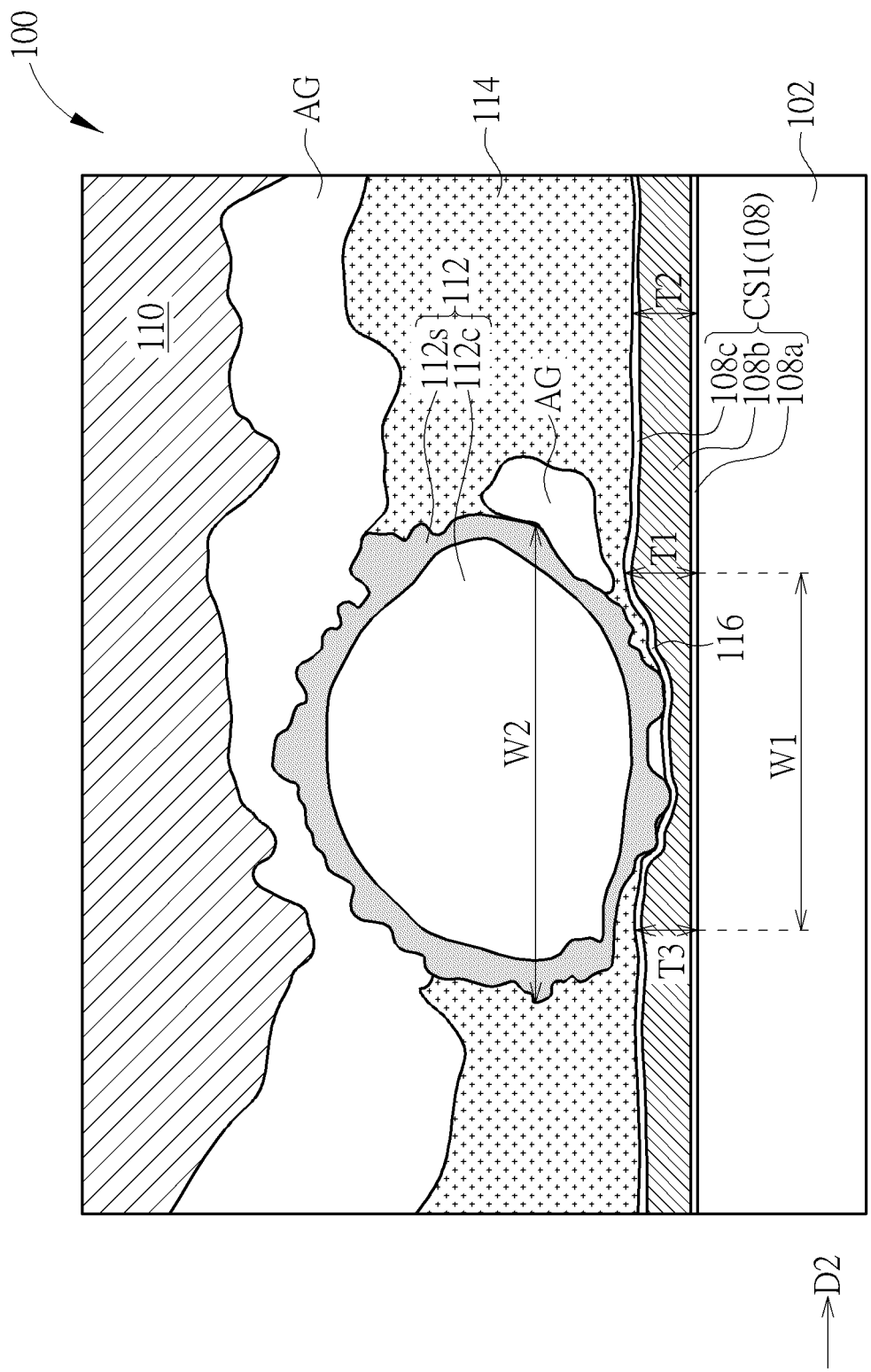
FIG. 7 is a partial schematic outline of a SEM diagram of an electronic device according to a second exemplary embodiment of the present disclosure.

Referring to FIG. 7, FIG. 7 is a partial schematic outline of a SEM diagram of an electronic device according to a second exemplary embodiment of the present disclosure. An enlargement schematic outline of the SEM diagram is shown. The shell 112s of the conductive particle 112 may have irregular and uneven surface, and the second width W2 is defined by the maximum width of the outer edge of the shell 112s in the direction D2. The thickness T1, the thickness T3, and the first width W1 can be measured in any SEM diagram and calculated using the similar definition as mentioned in FIG. 3, and will not be described repeatedly. In the SEM diagram, the air gap AG may be formed by peeling resulting from cutting process of SEM sample.

Figure 8:
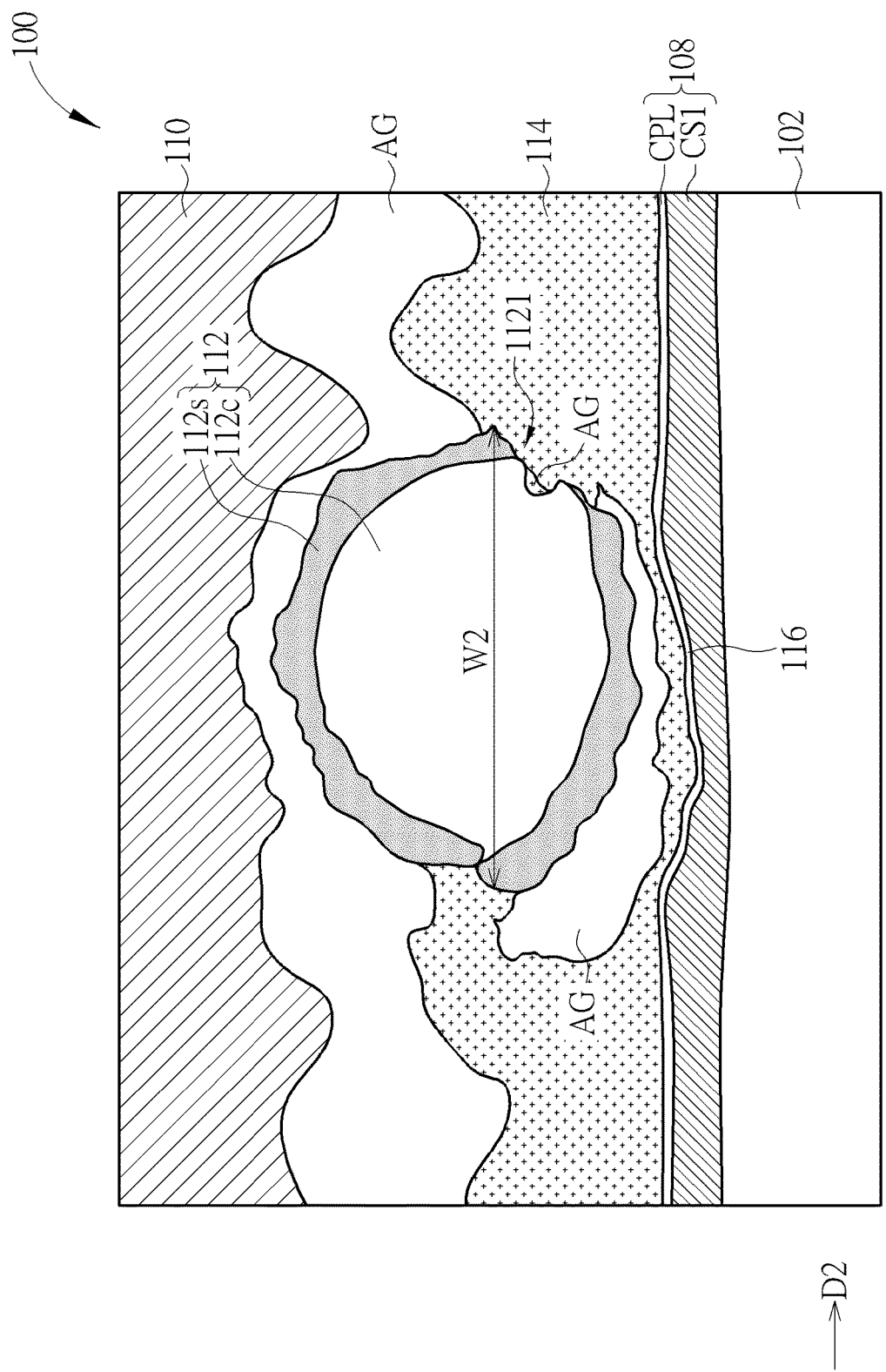
FIG. 8 is a partial schematic outline of a SEM diagram of an electronic device according to a third exemplary embodiment of the present disclosure.

Referring to FIG. 8, FIG. 8 is a partial schematic outline of a SEM diagram of an electronic device according to a third exemplary embodiment of the present disclosure. In this exemplary embodiment, the shell 112s of the conductive particle 112 may have one or more opening 1121, it can still provide conductivity to the first pad 108 and the second pad 110. The second width W2 can be obtained from the outer edge/surface of the shell 112s in the direction D2.

Figure 9:
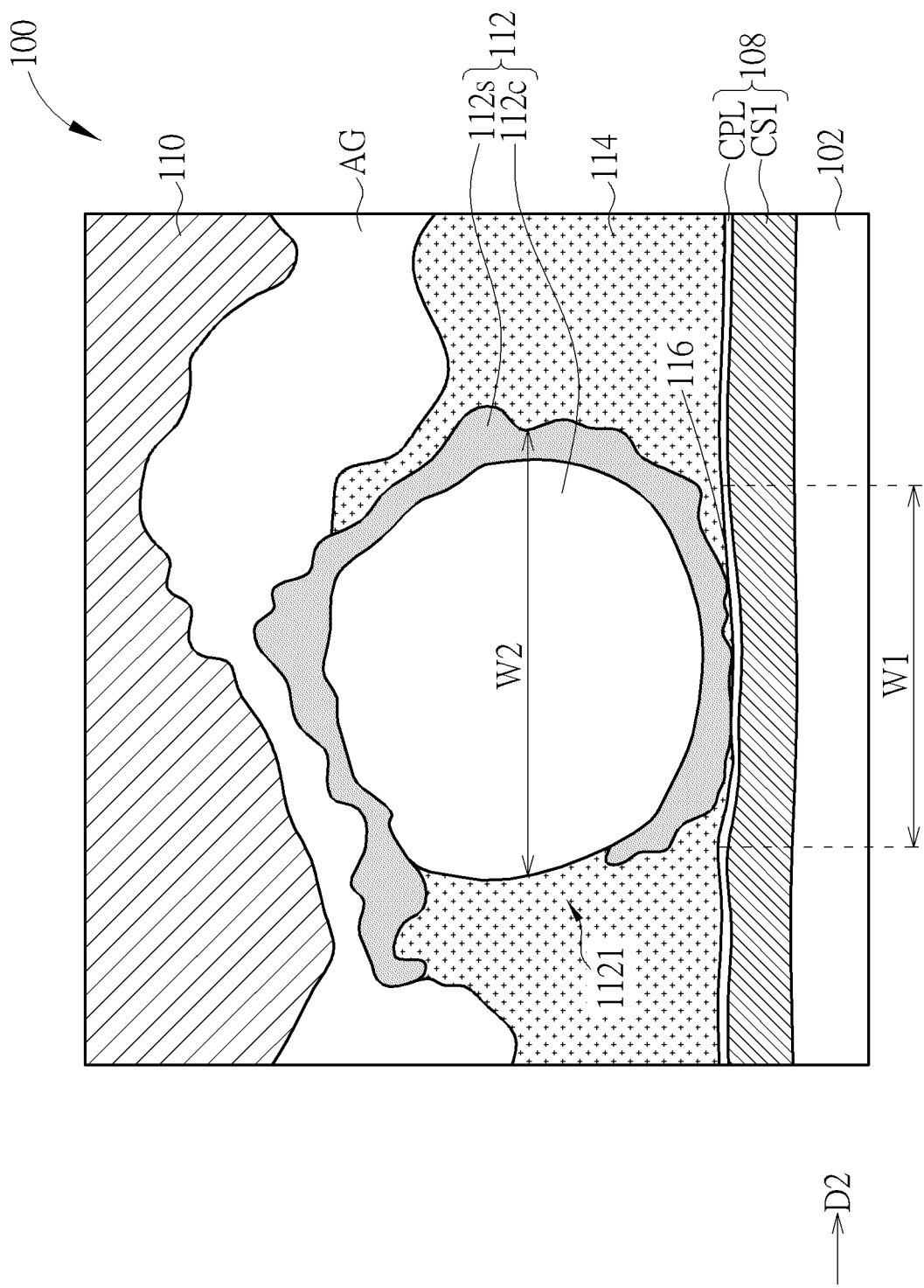
FIG. 9 is a partial schematic outline of a SEM diagram of an electronic device according to a fourth exemplary embodiment of the present disclosure.

Referring to FIG. 9, FIG. 9 is a partial schematic outline of a SEM diagram of an electronic device according to a fourth exemplary embodiment of the present disclosure. In this exemplary embodiment, the shell 112s has an opening 1121 and a part of the shell 112s may peel from the core 112c. The second width W2 may be measured from an outer edge of the core 112c to another outer edge of the core 112c or the shell 112s in the direction D2 to obtain the maximum width.

Figure 10:
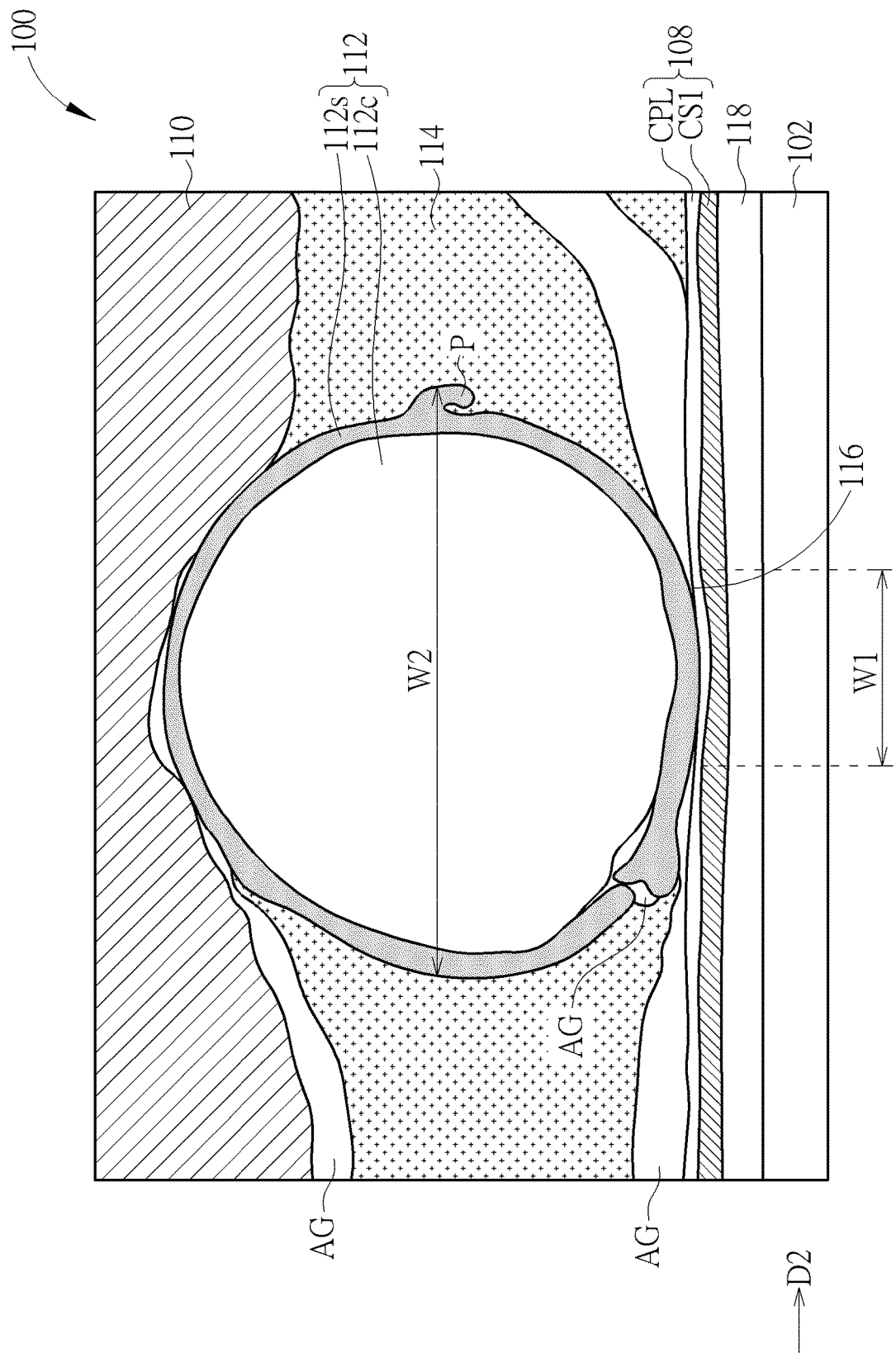
FIG. 10 is a partial schematic outline of a SEM diagram of an electronic device according to a fifth exemplary embodiment of the present disclosure.

Referring to FIG. 10, FIG. 10 is a partial schematic outline of a SEM diagram of an electronic device according to a fifth exemplary embodiment of the present disclosure. In this exemplary embodiment, the shell 112s of the conductive particle 112 may have a relatively smoother surface. The second width W2 of the conductive particle 112 may be measured from the outmost surface of the conductive particle 112 in the direction D2, even though the shell 112s has a protrusion P. An insulating layer 118 is shown between the substrate 102 and the first pad 108. In some embodiments, the insulating layer 118 may be a single-layer structure or a multi-layer structure, but it is not limited thereto.

Figure 11:
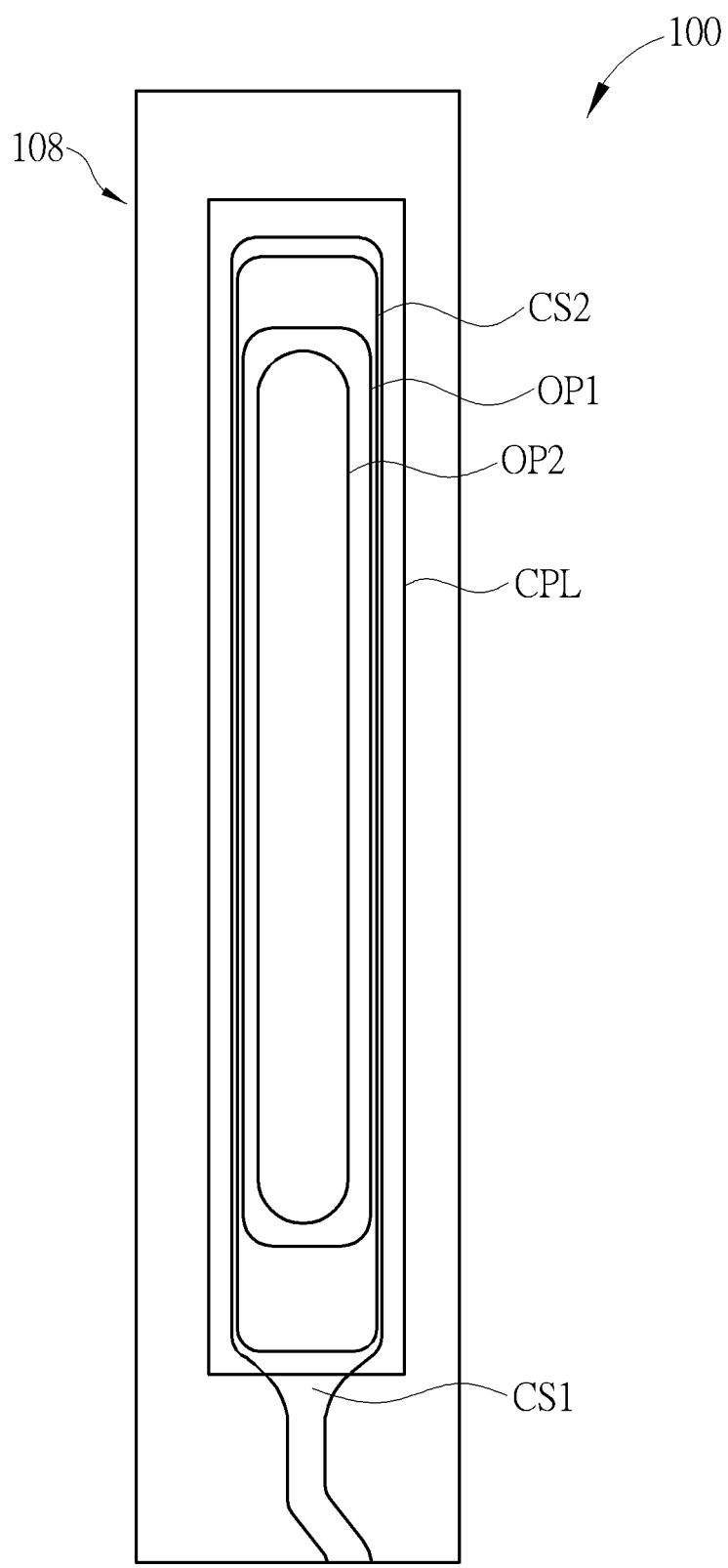
FIG. 11 is a partial schematic outline of an optical microscope (OM) diagram of an electronic device according to a sixth exemplary embodiment of the present disclosure.
Figure 12:
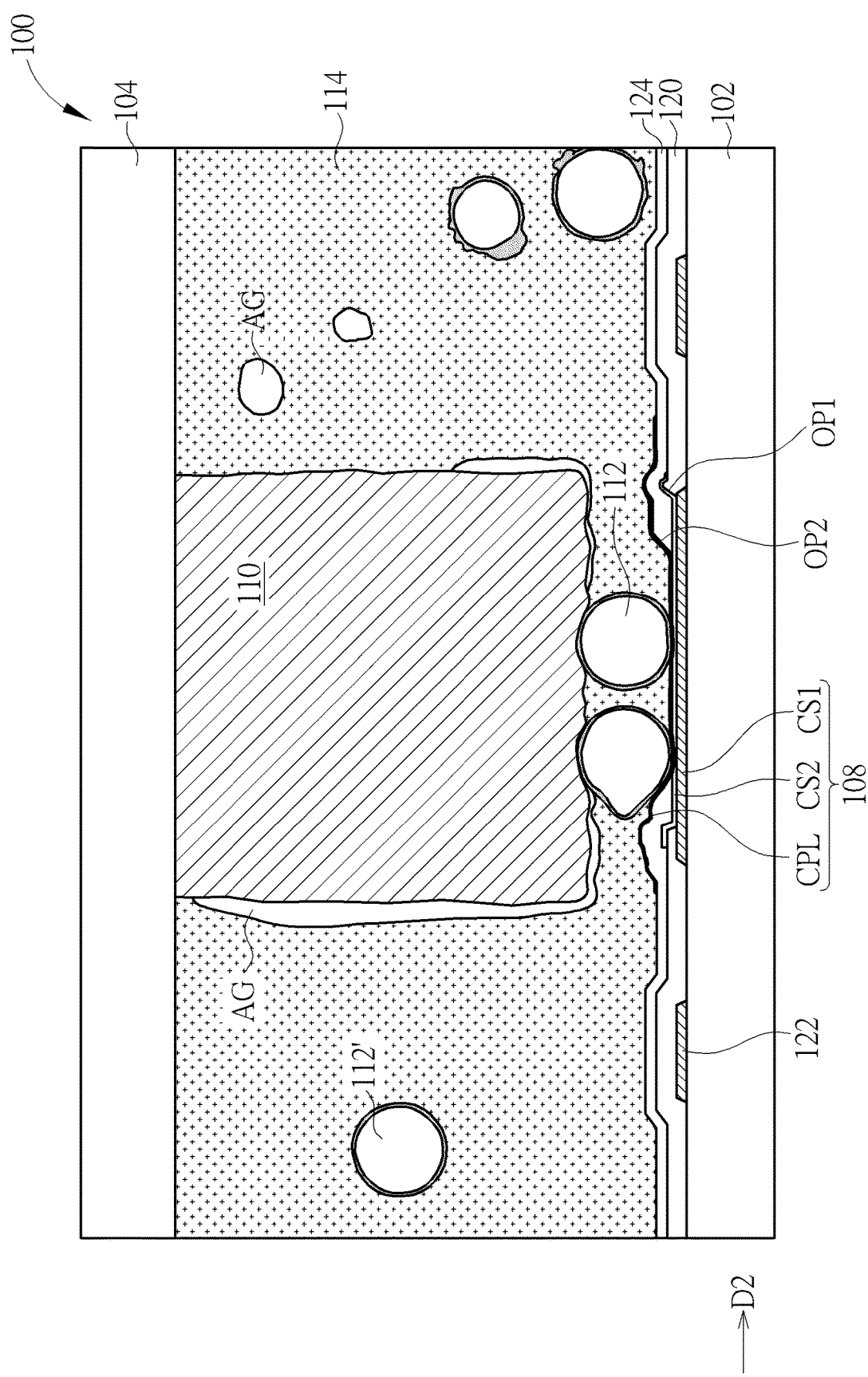
FIG. 12 is a partial schematic outline of a SEM diagram of the electronic device according to the sixth exemplary embodiment of the present disclosure.

Referring to FIG. 11 and FIG. 12, FIG. 11 is a partial schematic outline of an optical microscope (OM) diagram of an electronic device according to a sixth exemplary embodiment of the present disclosure, and FIG. 12 is a partial schematic outline of a SEM diagram of the electronic device according to the sixth exemplary embodiment of the present disclosure, wherein FIG. 11 shows the profile of the first pad 108 when the conductive particles 112 and the second pad 110 are not disposed on the first pad 108. In FIG. 12, two conductive particles 112 are disposed between the first pad 108 and the second pad 110. In addition, the first pad 108 includes a first conductive set CS1, a second conductive set CS2 disposed on the first conductive set CS1, and a conductive protection layer CPL disposed on the second conductive set CS2. The first conductive set CS1 and the second conductive set CS2 may independently include a Mo layer, a Ti layer, a Mo/Al/Mo structure, a Ti/Al/Ti structure, a Mo/Al/Ti structure, or a Ti/Al/Mo structure, but not limited thereto. For example, both the first conductive set CS1 and the second conductive set CS2 have a Mo/Al/Mo structure. The conductive protection layer CPL may include an ITO layer. The electronic device 100 includes an insulating layer 120 covers a portion of the first conductive set CS1. The insulating layer 120 has an opening OP1 that exposes a portion of the first conductive set CS1. At least a portion of the second conductive set CS2 is disposed in the opening OP1 and directly in contact with the first conductive set CS1 through the opening OP1. The first conductive set CS1 is electrically connected with the second conductive set CS2 through the opening OP1. The electronic device 100 may further include an insulating layer 124 covers the insulating layer 120 and a portion of the second conductive set CS2. The insulating layer 124 has an opening OP2 that exposes a portion of the second conductive set CS2. The conductive protection layer CPL covers a portion of the insulating layer 124 and is directly in contact with the second conductive set CS2 through the opening OP2. The wires 122 disposed adjacent to the first pad 108 may have similar structures with the first conductive set CS1. For example, the wires 122 may have a Mo/Al/Mo structure respectively, but not limited thereto. The insulating layer 120 covers the wires 122 in this exemplary embodiment.

Figure 13:
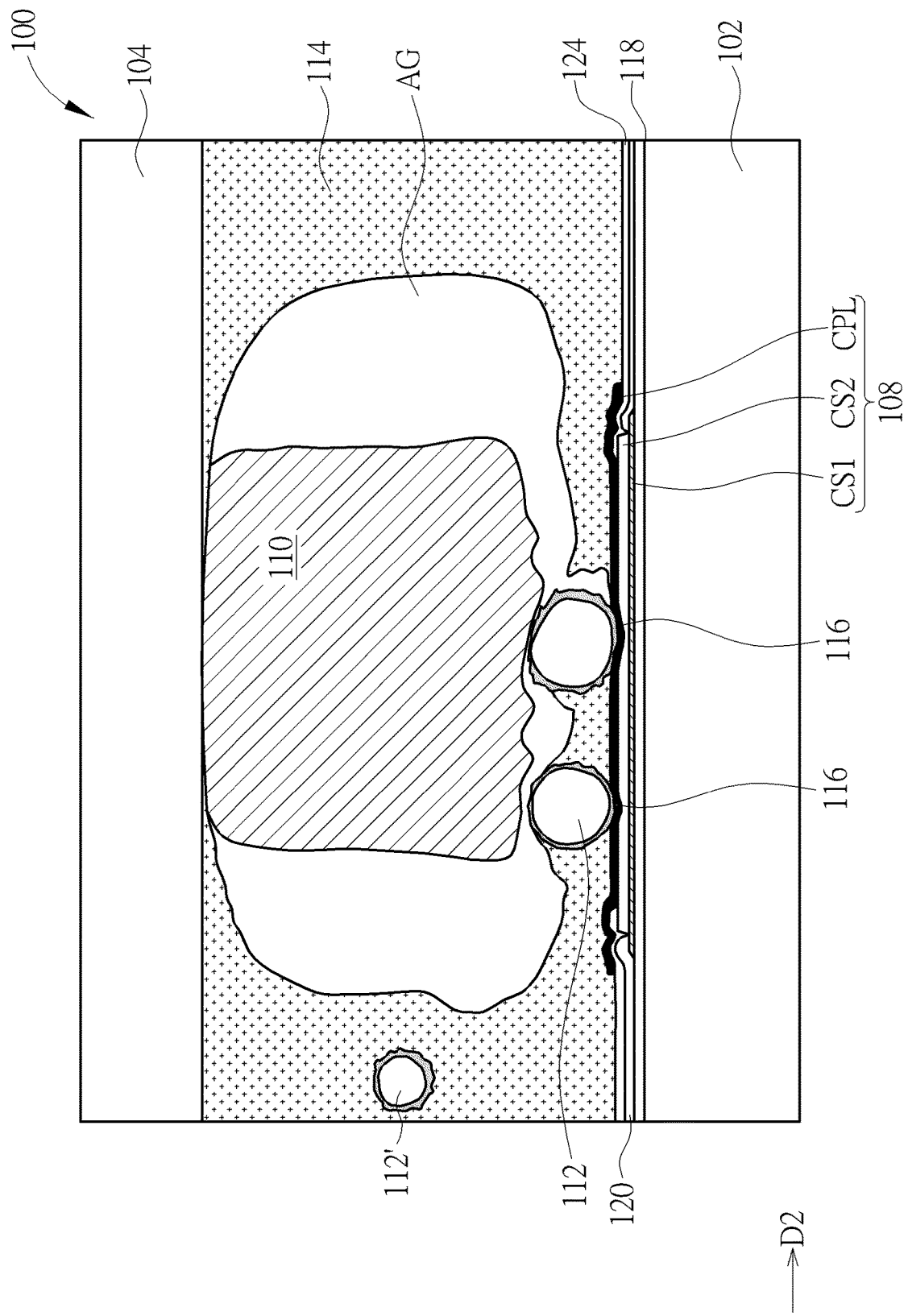
FIG. 13 is a partial schematic outline of a SEM diagram of an electronic device according to a seventh exemplary embodiment of the present disclosure.

Referring to FIG. 13, FIG. 13 is a partial schematic outline of a SEM diagram of an electronic device according to a seventh exemplary embodiment of the present disclosure. In this exemplary embodiment, the first conductive set CS1 may include one single conductive layer, such as a Mo layer. The second conductive set CS2 may have a multilayer structure, such as a Mo/Al/Mo structure. The conductive protection layer CPL covers the second conductive set CS2 and a portion of the insulating layer 124. The conductive protection layer CPL may include an ITO layer, but not limited thereto. An insulating layer 118 is disposed between the first pad 108 and the substrate 102. The insulating layer 118 may serve as a buffer layer and may include silicon nitride (SiNx) or silicon oxide (SiOx) material, but not limited thereto.

Figure 14:
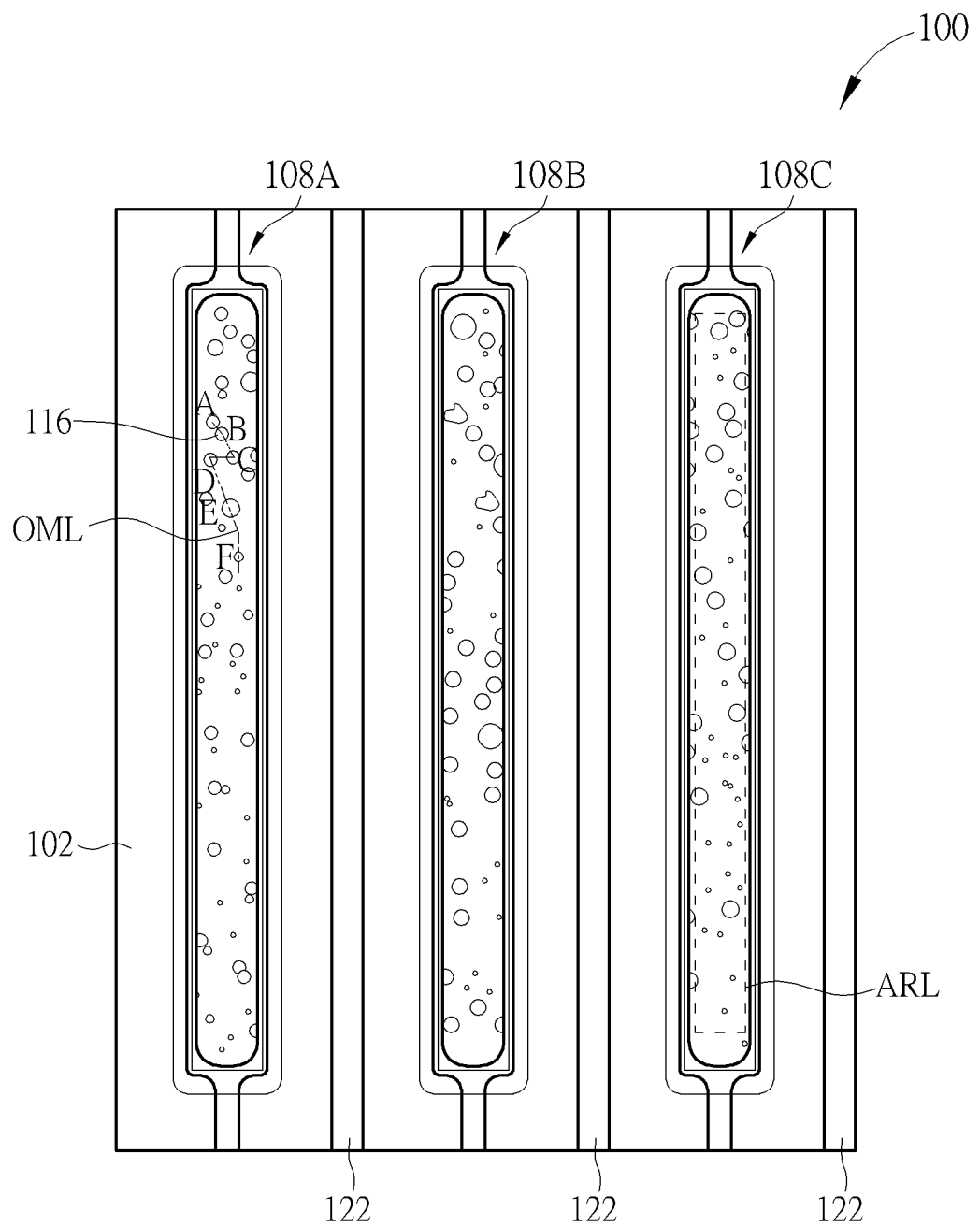
FIG. 14 is a partial schematic outline of a 3D OM diagram of an electronic device according to an eighth exemplary embodiment of the present disclosure.
Figure 15:
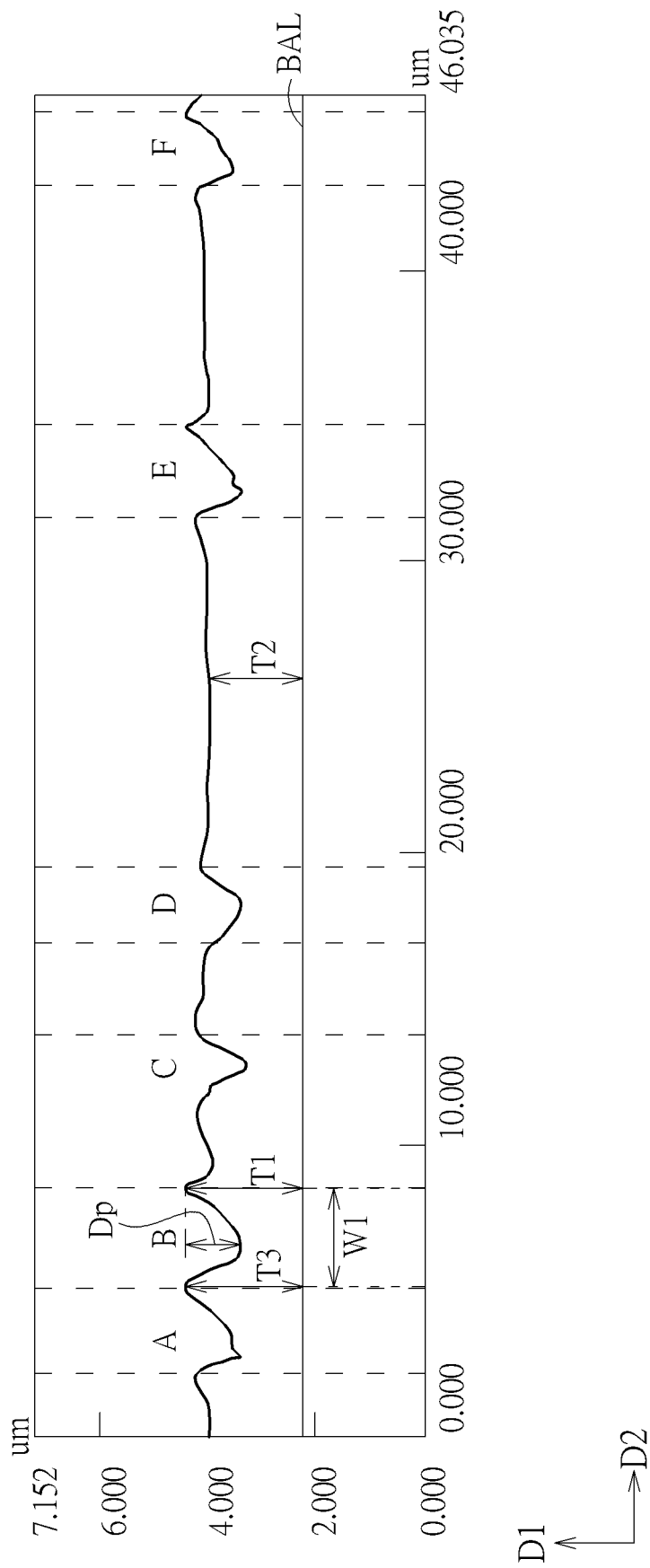
FIG. 15 is a schematic profile chart obtained from the 3D OM diagram in FIG. 14 along the line OML.

Referring to FIG. 14 and FIG. 15, FIG. 14 is a partial schematic outline of a 3D OM diagram of an electronic device according to an eighth exemplary embodiment of the present disclosure, and FIG. 15 is a schematic profile chart obtained from the 3D OM (or OM) diagram in FIG. 14 along the line OML, wherein the FIG. 14 shows three first pads 108A, 108B, 108C and three wires 122 alternately positioned on the substrate 102. After the second pad and IC chip are removed from the first pads 108A, 108B, 108C, a plurality of recesses 116 may be shown on the surface of the first pads 108A, 108B, and/or 108C. In the first pad 108A, recess "A", recess "B", recess "C", recess "D", recess "E", and recess "F" are selected to calculate the vertical profiles along the line OML, so as to obtain FIG. 15. In FIG. 15, taking the recess "B" as an example, the maximum thickness T1 and the secondary maximum thickness T3 can be determined according to a selected base line BAL. The selected base line BAL may be any horizontal line below all the measured recesses as shown in FIG. 15. The first width W1 can be measured in the direction D2 between the point of the recess "B" with the maximum thickness T1 and the point of the recess "B" with the secondary maximum thickness T3, the maximum thickness T1 and the secondary maximum thickness T3 are at opposite sides of the lowest point of the recess "B". In addition, the depth Dp of the recess "B" can be further determined from the bottom (the point of the recess "B" with the minimum thickness determined according to the selected base line BAL) to the top (the point of the recess "B" with the maximum thickness T1) in the direction D1. By the similar method, the first width W1 and the depth Dp can be measured in different samples as the following table.

|  | W1 (μm) | Dp (μm) | W3 (μm) |
| --- | --- | --- | --- |
| Sample I | 1.905 to 2.667 | 0.462 to 1.941 | 3.274 |
| Sample II | 2.996 to 2.709 | 0.821 to 1.814 | 3.735 |
| Sample III | 2.224 to 2.817 | 0.285 to 1.941 | 3.051 |
| Sample IV | 2.431 to 2.817 | 0.631 to 1.894 | 3.471 |

In some embodiments, the first width W1 of the recess may be in a range from 1.5 μm to 3.5 μm (1.5 μm≤W1≤3.5 μm), and the depth Dp of the recess may be in a range from 0.1 μm to 2.2 μm (0.1 μm≤Dp≤2.2 μm), but not limited thereto. In some embodiments, the first width W1 may be 1.7 µm, 2 µm, 2.3 µm, 2.5 µm, 2.7 µm, 3 µm or 3.2 µm, but not limited thereto. In some embodiments, the depth Dp may be 0.3 µm, 0.5 µm, 0.7 µm, 0.9 µm, 1.1 µm, 1.3 µm, 1.5 µm, 1.7 µm or 1.9 µm, but not limited thereto. In another aspect, a third width W3 of different samples can be measured by an optical microscope (OM) before the second pad and the IC chip are removed. More specifically, the third width W3 is an average of a maximum width of any three conductive particles 112' (not the conductive particles 112) measured in any OM image. In some embodiments, the third width W3 of the conductive particles 112' may be in a range from 2 µm to 6 µm ($2 \ \mu m \leq W3 \leq 6 \ \mu m$), but not limited thereto. In some embodiments, the third width W3 of the conductive particles 112' may be 2.5 µm, 3 µm, 3.5 µm, 4 µm, 4.5 µm, 5 µm or 5.5 µm, but not limited thereto. A ratio of the first width W1 to the third width W3 may be in a range from 0.25 to 1 ($0.25 \leq W1/W3 \leq 1$). For example, the ratio may be 0.3, 0.4, 0.5, 0.6, 0.7, 0.8 or 0.9, but not limited thereto. A ratio of the depth Dp to the third width W3 may be in a range from 0.01 to 0.4 ($0.01 \leq D/W3 \leq 0.4$). For example, the ratio may be 0.05, 0.1, 0.15, 0.2, 0.25, 0.3 or 0.35, but not limited thereto. In some embodiments, the third width W3 is different from the first width W1.

According to FIG. 14 and FIG. 15, the electronic device 100 of the present disclosure may include a substrate 102, a first pad (e.g. 108A) disposed on the substrate 102, and a conductive particle (e.g. the conductive particle 112' shown in FIG. 2) disposed on the substrate 102. The first pad 108A has a recess 116 with a first width W1 and the conductive particle (not shown) has a third width W3. The first width W1 may be in a range from 1.5 micrometers (µm) to 3.5 µm ($1.5 \ \mu m \leq W1 \leq 3.5 \ \mu m$). For example, the first width W1 may be 1.7 µm, 2 µm, 2.3 µm, 2.5 µm, 2.7 µm, 3 µm or 3.2 µm, but not limited thereto. The third width W3 may be in a range from 2 µm to 6 µm ($2 \ \mu m \leq W2 \leq 6 \ \mu m$). For example, the third width W3 may be 2.5 µm, 3 µm, 3.5 µm, 4 µm, 4.5 µm, 5 µm or 5.5 µm, but not limited thereto. In some embodiments, the first width W1 is less than or equal to the third width W3 ($W1 \leq W3$). The ratio of the first width W1 to the third width W3 is in a range from 0.25 to 1 ($0.25 \leq W1/W3 \leq 1$). For example, the ratio may be 0.3, 0.4, 0.5, 0.6, 0.7, 0.8 or 0.9, but not limited thereto.

In addition, the roughness Ra and the roughness Rms of the first pads 108A, 108B, 108C can be measured by 3D OM. As shown in FIG. 14, a constant area represent by the frame ARL can be selected for measuring the first pads 108A, 108B, 108C to obtain the roughness Ra and/or Rms. In some embodiments, the roughness may be in a range from 0.01 µm to 0.3 µm ($0.01 \ \mu m \leq roughness \leq 0.3 \ \mu m$), but not limited thereto. More specifically, the roughness Ra may be in a range from 0.01 µm to 0.2 µm ($0.01 \ \mu m \leq Ra \leq 0.2 \ \mu m$), and the roughness Rms may be in a range from 0.02 µm to 0.3 µm ($0.02 \ \mu m \leq Rms \leq 0.3 \ \mu m$), but not limited thereto. In some embodiments, the roughness Ra may be 0.05 µm, 0.07 µm, 0.1 µm, 0.13 µm, 0.15 µm or 0.17 µm, but not limited thereto. In some embodiments, the roughness Rms may be 0.05 µm, 0.07 µm, 0.1 µm, 0.13 µm, 0.15 µm, 0.17 µm, 0.2 µm, 0.23 µm, 0.25 µm or 0.27 µm, but not limited thereto. In a variant exemplary embodiment, the roughness Ra may be in a range from 0.020 µm to 0.043 µm ($0.020 \ \mu m \leq Ra \leq 0.043 \ \mu m$), and the roughness Rms maybe in a range from 0.033 µm to 0.079 µm ($0.033 \ \mu m \leq Rms \leq 0.079 \ \mu m$), but not limited thereto. The roughness Rm and Rms may be measured by atomic force microscope (AFM), 3D OM or any other suitable instruments.

Figure 16:
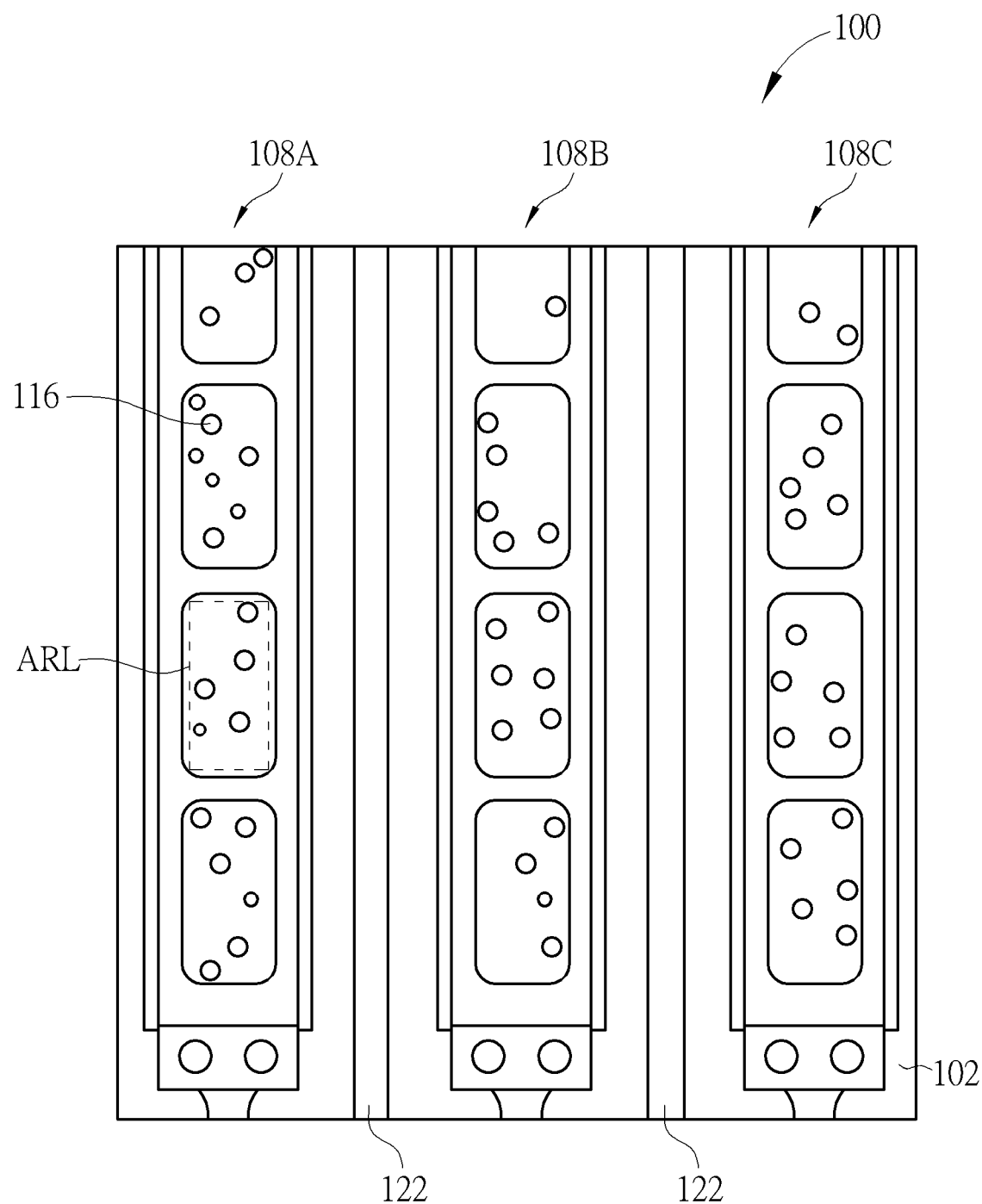
FIG. 16 is a partial schematic outline of a 3D OM diagram of an electronic device according to a ninth exemplary embodiment of the present disclosure.

Referring to FIG. 16, FIG. 16 is a partial schematic outline of a 3D OM (or OM) diagram of an electronic device according to a ninth exemplary embodiment of the present disclosure. This exemplary embodiment shows another kind of first pads 108A, 108B, 108C with different outline. By using the similar method in the eighth exemplary embodiment, the roughness Rm and Rms can be obtained, wherein the area represented by the frame ARL is determined to measure the roughness. In this exemplary embodiment, the roughness Ra may be in a range from 0.05 µm to 0.15 µm ($0.05 \ \mu m \leq Ra \leq 0.15 \ \mu m$), and the roughness Rms may be in a range from 0.1 µm to 0.2 µm ($0.1 \ \mu m \leq Rms \leq 0.2 \ \mu m$), but not limited thereto. In some embodiments, the roughness Ra may be 0.06 µm, 0.07 µm, 0.08 µm, 0.09 µm, 0.1 µm, 0.11 µm, 0.12 µm, 0.13 µm or 0.14 µm, but not limited thereto. In some embodiments, the roughness Rms may be 0.11 µm, 0.12 µm, 0.13 µm, 0.14 µm, 0.15 µm, 0.16 µm, 0.17 µm, 0.18 µm or 0.19 µm, but not limited thereto.

According to the present disclosure, a conductive particle may be used for electrically connecting a first pad and a second pad in an electronic device. The first pad may have a recess corresponding to the conductive particle. The conductive particle may sink in the recess, the contact area between the first pad and the conductive particle maybe increased, and the electrical connection between the first pad and the conductive particle may be improved. The recess may help fixing the conductive particle more firmly for bonding or electrical connection between the first pad and the second pad. Different structures and/or compositions of the conductive layers of the first pad may be provided based on different requirements. For example, oxygen-containing conductive material or oxide conductive material may be adopted to form the top surface of the first pad.

Those skilled in the art will readily observe that numerous modifications and alterations of the device and method may be made while retaining the teachings of the disclosure. The present disclosure may include the combinations of any embodiment(s), variant(s) and/or the features described in claims. Accordingly, the above disclosure should be construed as limited only by the metes and bounds of the appended claims.

What is claimed is:

1. An electronic device, comprising:
a substrate;
a first pad disposed on the substrate, wherein the first pad has a first conductive set, a second conductive set disposed on the first conductive set, and a conductive protection layer disposed on the second conductive set;
an insulating layer disposed on the second conductive set, and the insulating layer has an opening exposing a portion of the second conductive set, wherein the conductive protection layer covers the second conductive set in the opening and extends over the opening to cover a portion of the insulating layer;
a second pad disposed opposite to the first pad; and
a conductive particle disposed between the first pad and the second pad;
wherein the first pad has a recess, and a part of the conductive particle sinks in the recess.

2. The electronic device of claim 1, wherein a maximum thickness of the first pad overlapping with the conductive particle is greater than a minimum thickness of the first pad not overlapping with the conductive particle.

3. The electronic device of claim 1, wherein a first width of the recess in a direction is less than or equal to a second width of the conductive particle in the direction.

4. The electronic device of claim 3, wherein the first width is in a range from 1.5 µm to 3.5 µm.

5. The electronic device of claim 3, wherein the second width is in a range from 2 µm to 6 µm.

6. The electronic device of claim 3, wherein a ratio of the first width to the second width is in a range from 0.25 to 1.

7. The electronic device of claim 1, wherein a depth of the recess is in a range from 0.1 µm to 2.2 µm.

8. The electronic device of claim 1, wherein the conductive particle includes a core and a shell surrounding the core, and the shell has an irregular surface.

9. The electronic device of claim 1, wherein the first conductive set is electrically connected with the second conductive set.

10. The electronic device of claim 9, wherein the first conductive set includes a titanium (Ti) layer, a molybdenum (Mo) layer, an aluminum (Al) layer, a Mo/Al/Mo structure, a Ti/Al/Ti structure, a Mo/Al/Ti structure, or a Ti/Al/Mo structure, and the second conductive set includes a titanium layer, a molybdenum layer, an aluminum layer, a Mo/Al/Mo structure, a Ti/Al/Ti structure, a Mo/Al/Ti structure, or a Ti/Al/Mo structure.

11. The electronic device of claim 1, wherein the first conductive set includes at least one metal layer and the conductive protection layer is disposed on the at least one metal layer.

12. The electronic device of claim 11, wherein the conductive protection layer is electrically connected with the at least one metal layer.

13. The electronic device of claim 1, wherein a roughness of a top surface of the first pad is in a range from 0.01 µm to 0.3 µm.

14. The electronic device of claim 1, further comprising an insulating layer disposed between the substrate and the first pad.

15. The electronic device of claim 14, wherein the insulating layer disposed between the substrate and the first pad is in a multilayer structure which includes a plurality of sub-insulating layers, and at least one of the sub-insulating layers has a different thickness from another one of the sub-insulating layers.

16. The electronic device of claim 1, further comprising an integrated circuit (IC) chip disposed on the second pad and electrically connected with the second pad.

17. The electronic device of claim 1, wherein the conductive protection layer includes an oxygen-containing conductive layer or an oxide layer.

18. An electronic device, comprising:
a substrate;
a first pad disposed on the substrate, wherein the first pad has a first conductive set and a conductive protection layer disposed on the first conductive set;
an insulating layer disposed on the first conductive set, and the insulating layer has an opening exposing a portion of the first conductive set, wherein the conductive protection layer covers the first conductive set in the opening and extends over the opening to cover a portion of the insulating layer;
a second pad disposed opposite to the first pad; and
a conductive particle disposed between the first pad and the second pad,
wherein the first pad has a recess, and a part of the conductive particle sinks in the recess,
wherein the conductive protection layer includes an oxygen-containing conductive layer or an oxide layer.

* * * * *